United States Patent [19]

Mercier et al.

[11] Patent Number: 4,601,781
[45] Date of Patent: Jul. 22, 1986

[54] METHOD FOR IMPROVING STEP COVERAGE OF DIELECTRICS IN VLSI CIRCUITS

[75] Inventors: Jacques S. Mercier, Kanata; Vu Q. Ho, Ottawa, both of Canada

[73] Assignee: Northern Telecom Limited, Montreal, Canada

[21] Appl. No.: 659,145

[22] Filed: Oct. 9, 1984

[30] Foreign Application Priority Data

Jun. 15, 1984 [CA] Canada .................................. 456666

[51] Int. Cl.⁴ ........................ B44C 1/22; C03C 15/00; C03C 25/06
[52] U.S. Cl. .................................... 156/643; 29/591; 156/646; 156/653; 156/657; 204/192 E; 357/71; 427/89; 427/93
[58] Field of Search ............... 156/643, 646, 653, 657, 156/662, 656; 204/164, 192 EC, 192 E; 427/38, 39, 88-91, 93-95; 29/591, 576 W, 578; 357/65, 68, 71

[56] References Cited

U.S. PATENT DOCUMENTS 4,377,438 3/1983 Moriya et al. ...................... 156/643
4,524,508 6/1985 Sato ................................. 156/657 X

*Primary Examiner*—William A. Powell
*Attorney, Agent, or Firm*—Stuart L. Wilkinson

[57] ABSTRACT

Particularly for use in multilevel metallization structures in which the underlying topography consists of fine and sharply contoured conductor lines produced by dry etching, conformal or near planar dielectric coatings are produced by depositing a dielectric layer to a thickness over the conductor of at least three times the conductor thickness. The dielectric is then anisotropically etched back to a thickness comparable with that of the underlying conductor. By this method a smooth dielectric top surface can be obtained without the requirement for multiple processing steps characterizing alternative planarizing techniques.

11 Claims, 5 Drawing Figures

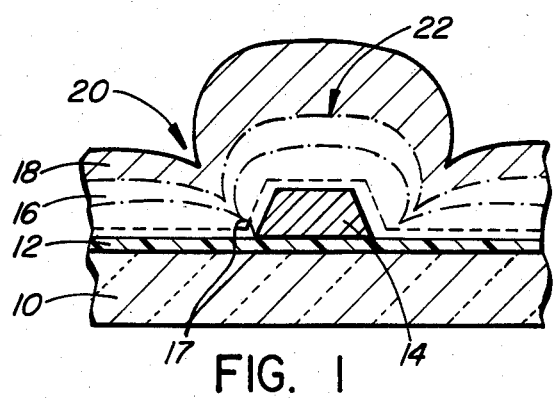
FIG. 1
PRIOR ART
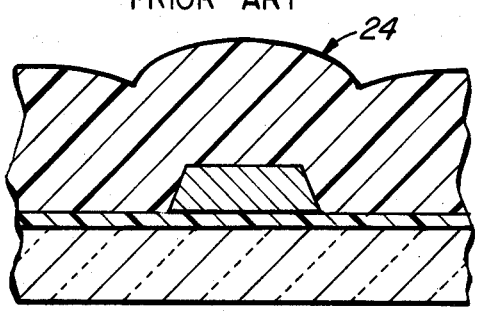
FIG. 2
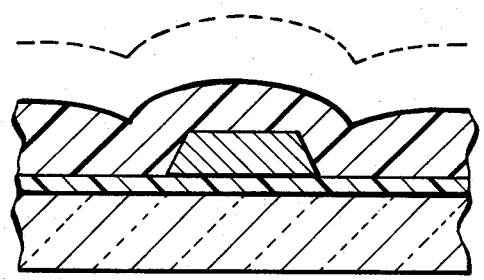
FIG. 3
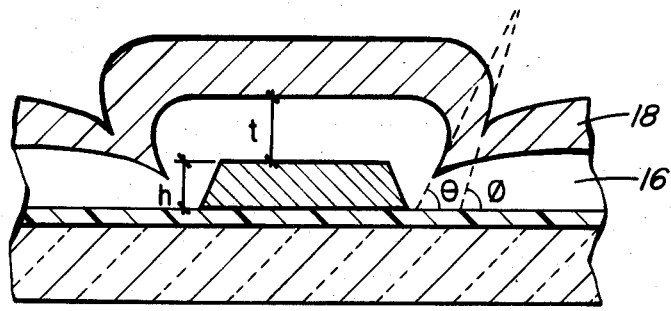
FIG. 4   $\phi > \theta$

METHOD FOR IMPROVING STEP COVERAGE OF DIELECTRICS IN VLSI CIRCUITS

This invention relates to very large scale integrated (VLSI) circuits and to methods used for their fabrication. The invention has particular application to a method for evenly covering sharp profile integrated circuit features with dielectric films.

One known way of increasing the packing density of integrated circuits is by using several interconnect layers to obtain a multilevel metallization (MLM) structure. Such structures include a semiconductor substrate, an overlying dielectric, a first metallization layer, a second dielectric layer, and a second metallization layer. Although the dielectric layers are essentially blanket layers which have vias or connection windows through them, the conducting layers are dry etched to leave very thin lines. Typically the lines of the top metallization layer extend othogonally to those of the lower metallization layer.

In recent years, very high packing density of integrated circuits has been achieved. A contributory factor has been the development of high resolution dry etching techniques such as plasma and reactive ion etching. Using dry etching a 1 μm thick metal layer can be defined into lines having a width and spacing of less than 1 μm. The features defined within the metal layer have sharp profiles and generally vertical bounding walls. While this is ideal for resolution and device isolation it creates a problem in making multilevel metallization (MLM) structures.

In the manufacture of MLM structures the upper surface of a deposited dielectric film should ideally be smooth and planar. Since this is difficult to achieve, then at the very least, the film should show some smoothing out of the underlyng topography. As indicated, the dry etching techniques required for fine line lithography produce features that can be much sharper than wet etching methods used in LSI technology. If is difficult to obtain satisfactory as-deposited coverage of these steep underlying features with currently available dielectric deposition techniques. In particular, as the deposition takes place, the sharp features of the etched metallization can have a shadowing effect on the subsequently deposited dielectric layer. Thus for example, while a very thin layer of low pressure chemical vapour deposited phospho-silicate glass (LPCVD PSG) of the order of 1000Å has almost no thickness variation and conforms closely to a 1 um thick underlying topography, a thicker layer, of the order of 1 μm, is much more influenced by the sharp corners of the metallization and shows thickness variations typically of 2:1. A layer of PSG of 2 μm is even worse.

One resulting problem during circuit use is that the thin PSG regions represent likely sites for insulation breakdown. The topography shadowing effect also occurs in the second layer of metallization deposited over the PSG or other insulator in a MLM structure. When the circuit is used, thin regions of overlying metallization can result in hot spots with consequent electromigration problems and opening of the interconnect lines.

Kern et al, Improved Reliability of Electron Devices through Optimized Coverage of Surface Topography, IEEE, 11th Annual Proceeding of Reliability Physics, p. 214, 1973, note that the severity of undesirable contours becomes generally worse with thicker layers and as the number of alternating dielectric and conductor layer increases. They remark that it is therefore imperative to maintain minimum layer thickness.

Similarly Levin et al note in "The step coverage of undoped and phosphorus-doped $SiO_2$ glass films", Journal of Vacuum Science Technology, B1, Jan-March 1983, page 55, that the non-conformal step coverage of deposited glass films results primarily from geometrical shadowing effects and that once sharp angles appear at the film surface the shadowing problem is aggravated by a self-shadowing effect.

High temperature dielectric reflow cycles presently widely utilized in the industry to smooth-out and densify pre-metal or first deposited dielectric films cause problems because of redistribution of dopants in underlying junctions within the semiconductor. This problem is especially severe in shallow junction VLSI circuits. Furthermore, in MLM structures, the deposition of dielectric film used between the two successive metallization levels should not require any heat treatment at a temperature high enough either to melt the metal lines or to promote interdiffusion at the metal/dielectric or the metal/semiconductor interfaces.

As an alternative to dielectric reflow, several planarization techniques are known for obtaining a substantially planar dielectric top surface. Certain of these techniques need sacrificial planarization layers, such as resists [A. C. Adams, Solid State Technol. 24 (4), 178 (1981) and E. R. Sirkin and I. A. Blech, J. Electrochem. Soc. 131, 123 (1984)] or silicon nitride [H. Hazuki, T. Miriya and M. Kashiwagi, Digest Techn. Papers, 1982 Symposium on VLSI Technology, paper no. 2-1, IEEE, p. 18 and M. O. Aboelfotoh, IBM Tech. Disclos. Bull. 26, 4115 (1984)]. In these methods precise characterization and control of differential etch rates are required. Other complicated lift-off procedures are known where low temperature directional processes, such as electron cyclotron resonance plasma deposition, are needed to obtain a suitable $SiO_2$ layer [K. Ehara, T. Morimoto, S. Muramoto and S. Matsuo, J. Electrochem. Soc. 131, 419 (1984)]. In other methods, RF-bias sputtering is used in a complex technique involving simultaneous deposition and etching of $SiO_2$ to obtain self-planarized as-deposited films [M. Morimoto, T. Mogami, H. Okabayashi and E. Nagasawa, Digests. Techn. Papers, 1983 Symp. on VLSI Technol., Paper No. 7-8, IEEE, p. 100]. Generally the methods require many deposition steps and if both the initial dielectric layer and the intermetallization dielectric layers are planarized, the added process complexity is untenable. Also process control and reproducability can be a problem.

Particularly for PSG films grown using low pressure chemical vapour deposition (LPCVD) at low temperature of the order of 410° C., our studies show that the step coverage properties of dielectric films are not influenced at all by changes in major deposition parameters such as temperature, pressure, phosphorus content, gas flow rates, and the spacing of wafers within the deposition chaamer.

According to the invention there is provided a method of depositing a dielectric layer over sharply profiled conducting regions spaced from one another and formed on a semiconductor wafer the method comprising depositing the dielectric layer over the wafer to a thickness appreciably greater than the thickness of the conducting regions and then anisotropically etching the dielectric layer over the wafer to a thickness over the conducting regions comparable with the thickness of the conducting regions.

By depositing a dielectric layer to at least three times the height of the sharply defined underlying conducting regions, the shadow effect caused by sharp corners of the conducting regions is overcome. Since for subsequent lithographic process steps, such a thick dielectric film is undesirable, it is etched to bring its thickness down to a value comparable to the thickness of the underlying conducting regions and so ensure compatibility with typical VLSI processes.

The dielectric layer is preferably deposited by a low temperature process such as low-pressure chemical vapour deposition or plasma deposition and is removed by a dry etching technique such as reactive ion etching or plasma etching.

According to another aspect of the invention there is provided an integrated circuit produced using the method hereinbefore defined, the integrated circuit having a dielectic layer overlying sharply profiled conducting regions spaced from one another and deposited on a semiconductor wafer, the dielectric layer having a thickness measured over the conducting regions which is comparable to the thickness of the conducting regions, the dielectric layer extending substantially over the area of the integrated circuit and having an etched top surface.

In a multilevel metallization structure, the etched back dielectric layer is overlain by a second conducting layer. The dielectric is preferably silicon dioxide with the first level metallization being one of polysilicon, refractory metal, refractory metal silicide and the subsequent level being one of Al-Si or Al-Si-Cu alloy or a refractory metal.

An embodiment of the invention will now be described by way of example with reference to the accompanying drawings in which:

FIG. 1 marked PRIOR ART is a sectional view of part of an integrated circuit during manufacture thereof showing the effect of progressively depositing a dielectric layer over sharply profiled integrated circuit features;

FIG. 2 is a sectional view of part of an integrated circuit according to the invention during one stage of manufacture thereof;

FIG. 3 is a sectional view of the integrated circuit part during a subsequent stage of manufacture;

FIG. 4 is a sectional view showing part of a multilevel metallization VLSI circuit in which critical variables are labelled.

Figure 5:
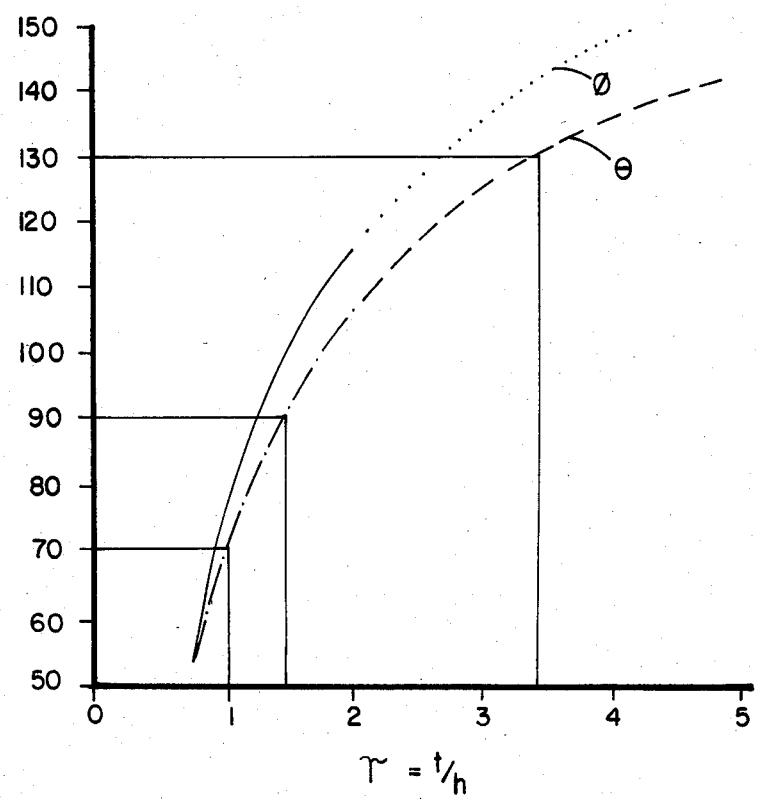
FIG. 5 is a graphical illustration using the variables of FIG. 4 and relating topography of deposited dielectric layer to the ratio between the thickness of the dielectric layer and the thickness of underlying conducting features.

Referring to FIG. 1, marked PRIOR ART, in detail, there is shown in sectional view a silicon substrate 10 forming part of an integrated circuit. Overlying the semiconductor is a thermally grown silicon dioxide layer 12 having a typical thickness of 0.5 to 1.0 $\mu$m and overlying this is a low pressure chemically vapour deposited polysilicon film which is patterned into lines 14 by reactive ion etching. The profile of the polysilicon lines 14 is very sharp having very clearly defined upper and lower corners 17. Overlying the 1 $\mu$m thick conducting lines is a layer 16 of phosphosilicate glass dielectric. The dielectric serves to insulate the lines 14 from a subsequently deposited and photodefined array of transverse conducting lines 18.

The polysilicon film is LPCV deposited at 625° C. and is then patterned by reactive ion etching which produces steep sides. Other conductors such as aluminum when dry etched produce equally sharp profile features. A PSG film is then deposited using a furnace temperature of 410° C., a pressure of 400 mTorr and a wafer spacing of 9.5 mm. The PSG is produced by reacting silane (SiH4), oxygen, phosphine and nitrogen to produce a silica film with a 4% phosphorus content. The second conductor is an Al-(1%)Si alloy film sputter deposited using a DC-magnetron system with DC bias and wafer pretreating for improved aluminum step coverage.

As shown by the broken lines representing progressive deposition of dielectric, the first 1000A of PSG are deposited in a configuration which conforms closely to the shape of the underlying polysilicon and oxide surface. As more PSG is deposited, the film thickness starts to vary as a function of position. In particular, the influence of the sharp corners 17 produces an angled, re-entrant portion 20 which becomes more marked as the thickness of the film is increased to a desired thickness comparable to that of the underlying polysilicon. In fact, as shown by the contour 22, as the thickness of dielectric film 16 is increased even further, the shadow effect produced by the sharp corners is clearly still more severe.

Referring to FIG. 2, there is shown the effect of continuing PSG deposition to a thickness greater than that shown in FIG. 1. The angled re-entrant portion is gradually filled and surface 24 of the PSG layer 16 eventually adopts a configuration which is between that of a planar surface and that of a surface fully conforming to the topography of the underlying polysilicon and oxide surfaces.

With a dielectric layer thickness of about 3 $\mu$m, further processing such as the formation of bias and contact holes, is made more difficult. To overcome this problem, the dielectric layer is etched backd to yield a ratio of t/h which is closer to unity.

In one method, reactive ion etching (RIE) of the overthick PSG film is performed in an AMT 8110 system with a hexagonal cathode configuration. Typical RIE conditions are: flow rates for [O$_2$]=33 sccm and for [CHF$_3$]-50 sccm, pressure=0.05 Torr and discharge power=1350 W. These conditions yielded an etch rate of approximately 500A/min. In an alternative method, plasma etching (PE) is performed using a Perkin-Elmer "Omni-Etch" 10000. The PE conditions are: flow rates for [Ar]=330 sccm, for [CHF$_3$]=20 sccm and for [CF$_4$]=44 sccm, pressure =1.8 Torr and discharge power=255 W. An etch rate of approximately 125A/-sec. is obtained under these conditions.

Second level Al:Si metallization is then deposited as described previously with reference to FIG. 1.

Referring to the schematic sectional view of FIG. 4, a measure $\theta$ of the re-entrant region 20 and a measure $\phi$ of a corresponding re-entrant region within the overlying conductor 18 is shown. Referring to the graphical representation of FIG. 5, one curve shows the angle $\theta$ of the re-entrant region 20 as a function of the ratio t/h where 't' is the thickness of the dielectric layer 16 deposited over the polysilicon, and 'h' is the thickness of the polysilicon lower level conductor 14 itself. The curve has a first span (chain line) corresponding to a polysilicon thickness of about 1 $\mu$m and a second span (broken line) corresponding to a polysilicon thickness of about 0.4 μm. The curve shows that at a ratio of t/h=1 an angle θ of about 70° is obtained. Approximately conformal deposition corresponding to θ equals 90° is obtained for a ratio of t/h of about 1.5 and an angle θ equals 130° corresponding to near planarity as shown in FIG. 2 is obtained for a value t/h of approximately 3.

Superimposed on the graphical analysis is a second curve which shows the angle θ of a corresponding re-entrant region in the upper metallization 18 as is indicated in FIG. 4. The full line span corresponds to a deposited second conductor layer of thickness 1 to 1.2 μm and a first conductor layer of 0.8 to 1 μm and the dotted line corresponds to a second conductor layer of 0.8 μm and a first conductor layer of 0.4 μm. In both cases the first layer of conductor is polysilicon and the second metal layer is aluminum/silicon alloy.

For thin dielectric layers, the severity of the dielectric re-entrant angle 20 is essentially repeated in the overlying metallization or conducting layer. The curves show that although the re-entrant formation 20 is less severe at a ratio of t/h of 2, considerable smoothing of the layer top surface is achieved by extending the ratio to 3 or more.

In the second layer of metallization, the permitted variation from uniform layer thickness is dictated by reliability concerns. In particular near-uniformity should be sought to minimize fractures of the metal lines near thinner areas since such fracture leads to open circuits. Furthermore, near constricted metal lines, a localized increase in current density can generate hot spots with consequent electromigration failures. For practical purposes the surface topography of the dielectric layer should ensure that there is no more than a 25% variation in thickness of the second metallization layer.

In principle, the step coverage angles θ and φ should be at least 90° so as to preclude any overhang. In practice, since θ is usually smaller than φ$_1$, it can be fact be 90° while still permitting φ$_1$ to remain above 90° and ensuring that the thickness of the second level metallization does not vary by more than 25%.

In practicing the invention, circuit design rules must be implemented to ensure that two re-entrant parts associated with a groove between two closely spaced conductor lines do not produce a void. If such a void exists, subsequent etch back may open up the void to create very sharp angle steps.

What is claimed is:

1. In a process for making VLSI circuits, a method of depositing a dielectric layer over sharply profiled conducting regions spaced from one another and formed on a substrate, the method comprising depositing a dielectric layer over the wafer to a thickness appreciably greater than the thickness of the conducting regions until differential growth caused by the sharp profiles of the conducting regions ceases, and then etching the dielectric layer over the wafer until the dielectric layer has a thickness over the conducting regions comparable with the thickness of the conducting regions.

2. A method as claimed in claim 1, in which the dielectric layer is deposited by low pressure chemical vapour deposition.

3. A method as claimed in claim 1, in which the dielectric layer is deposited by plasma deposition.

4. A method as claimed in claim 2, in which the dielectric layer is removed by an anisotropic etching technique.

5. A method as claimed in claim 4 in which the dielectric layer is etched by reactive ion etching.

6. A method as claimed in claim 4 in which the dielectric layer is etched by plasma etching.

7. A method as claimed in claim 1 in which the dielectric layer is deposited to at least twice the thickness of the conducting regions.

8. A method as claimed in claim 1 in which the dielectric layer is deposited to approximately three times the thickness of the conducting regions.

9. A method as claimed in claim 1 further comprising depositing and patterning a conducting layer over the etched dielectric layer.

10. A method as claimed in claim 1 in which the metallization is one of the group consisting of aluminum, polysilicon, an alloy of aluminum and silicon, a refractory metal and a refractory metal silicide.

11. A method as claimed in claim 1 in which the dielectric is one of the group consisting of doped and undoped silicate glass.

* * * * *